United States Patent [19]
Chiou et al.

[11] Patent Number: 6,039,526
[45] Date of Patent: Mar. 21, 2000

[54] AUTOMATIC PLUG PULLING MACHINE FOR IC TUBES

[75] Inventors: Chie-Wun Chiou; Horng-Huei Tseng, both of Hsinchu, Taiwan

[73] Assignee: Vanguard International Semiconductor Corporation, Hsin-Chu, Taiwan

[21] Appl. No.: 09/075,894

[22] Filed: May 11, 1998

[51] Int. Cl.[7] .................................................. B65G 47/78
[52] U.S. Cl. ......................... 414/411; 29/426.5; 414/810
[58] Field of Search ..................................... 414/403, 404, 414/411, 810; 29/426.5

[56] References Cited

U.S. PATENT DOCUMENTS

| | | | |
|---|---|---|---|
| 4,629,387 | 12/1986 | Stillman et al. | 414/404 |
| 4,648,773 | 3/1987 | Biegarski | 414/411 |
| 4,734,972 | 4/1988 | Hawkins | 29/426.4 |
| 4,760,924 | 8/1988 | Sato et al. | 414/403 X |
| 4,764,079 | 8/1988 | Linker, Sr. et al. | 414/411 |
| 4,775,279 | 10/1988 | Linker | 414/411 |
| 4,878,801 | 11/1989 | Pearson | 414/411 |
| 5,255,717 | 10/1993 | Nelson et al. | 138/89 |
| 5,261,775 | 11/1993 | Kobayashi | 414/403 |
| 5,465,483 | 11/1995 | Fink et al. | 29/890.031 |

FOREIGN PATENT DOCUMENTS

| | | | |
|---|---|---|---|
| 63-33130 | 2/1988 | Japan | 414/411 |
| 63-139819 | 6/1988 | Japan | 414/403 |

*Primary Examiner*—Gregory A. Morse
*Attorney, Agent, or Firm*—George O. Saile; Stephen B. Ackerman

[57] ABSTRACT

An automatic plug pulling machine for integrated circuit (IC) tubes is disclosed. Conventionally on a semiconductor manufacturing line, IC tubes are used to transport IC packages such as DIPs, SOPs and SOJs from one processing station to another. Commonly, IC packages inside the tubes are removed by pulling out the plug manually. This can be very time consuming resulting in reduced throughput. With the automatic pulling machine disclosed in the present invention, the tubes are loaded on to a pair of robotic arms with slots and grooves to receive a tube. The arm transports the tube to a platform where the tube is clamped down and positioned relative to two plug pullers. The top plug puller with a finger-like notch, which when lowered to one end of the tube, snugly fits over the head of the plug, and the lower plug puller also fits the bottom profile of the head of the plug. Then the plug pullers are moved horizontally, that is, sideways to move the plug out from the tube automatically. The plug and the unplugged tube are discarded into a trough, and a bin, respectively.

30 Claims, 4 Drawing Sheets

AUTOMATIC PLUG PULLING MACHINE FOR IC TUBES

BACKGROUND OF THE INVENTION

(1) Field of the Invention

The present invention relates generally to plug pulling machines, and in particular, to machines for pulling plugs from Integrated Chip (IC) tubes in semiconductor manufacturing lines.

(2) Description of the Related Art

Machines for pulling plugs from conduits of different types and shapes, and used in many different applications are well known in their specific areas of interest. Plugs in most cases are completely disposed in a tube. Cork plugs in wine bottles are well known in this respect. And so are cork plugs for champagne bottles, but which, unlike with wine corks, generally protrude from the mouth of the champagne bottle with a bulbous portion. Heat exchanger tubes in general, and those in nuclear powered steam generators in particular are also equipped with plugs that are completely disposed in the tubes. These plugs have an explosive device such that when the heat-exchanger malfunctions, the explosive in the plug is activated and the plug is forced into close contact with the inside of the tube, thus blocking flow of the heat-exchanging fluid in the affected tube. As is known in the art, the fluid flowing inside the tube exchanges heat with the fluid flowing outside the tube. Occasionally a tube can become defective and leak, resulting in commingling of the two fluids. This is not desirable especially when radioactive materials leak from the heat exchanger of nuclear steam generators. And hence, when a leak occurs, the heat exchanger tube is plugged so that the fluid is not permitted to flow through the tube.

Plugs so disposed in tubes must be removed for recycling of the tubes. In the case with wine bottles, the cork plug is removed by piercing it with a cork-screw, screwing into the cork and then pulling the cork-screw out, and hence the cork with it, by any number of well-known techniques such as leveraging a sleeve of the cork-screw device against the mouth of the bottle. Plugs from heat exchanger tubes are actually drilled out as described in U.S. Pat. No. 4,734,972. More specifically, the tube plug removal machine of this Patent removes any type of tube plug by drilling into a plug portion with a threaded section of the tap drill bit after the drilled hole has been threaded by a tapping section thereof, and removing a portion of the tube holding the plug in the tube with a counterbore drill bit mounted concentrically about the tap drill bit. After a portion of the plug has been removed by the counterbore drill bit, pulling on the tap drill bit removes the remaining plug portion from the tube.

In other methods of prior art for easier removal of plugs from conduits employ not only static pulling on the plug, but also repetitive impulsive forces as well. Such a method disclosed is in U.S. Pat. No. 5,465,483. The method as described in this Patent is particularly suited to removing a plug from a heat-exchanger tube in a nuclear powered steam generator. For this purpose, two hydraulic actuators are used: one for moving an expansion member out of engagement with an interior plug wall, a second capable of attachment to the plug for applying a static pull force to the plug, and an arrangement connecting an air impact tool to the second hydraulic actuator for applying, simultaneously with the static force, high-frequency impulses to the plug.

A still another approach is adopted in some prior art methods for removing plugs from conduits. The plug itself is modified. Thus in U.S. Pat. No. 5,255,717, Nelson, et al. disclose an improved plug comprising a cylindrical shell having tapered sidewalls, a closed end, and open end, a cork-shaped expander element disposed within the shell that radially expands the tapered sidewalls of the shell into sealing engagement with the inner walls of a tube when axially drawn from the closed to the open end of the shell. The plug removal is accomplished by an expander remover that axially pushes the expander element backward against the closed end of the shell.

It will be appreciated by those skilled in the art of handling tubes containing integrated circuit, or IC, packages that the methods described above cannot be used to advantage on a semiconductor manufacturing line. Firstly, IC tubes are generally comprised of cylindrical or prismatic conduits of relatively thin plastic material. The tubes are used to transport fragile IC packages including dual-in-line packages (DIP), leadless-chip-carriers (LLCC), small-outline packages (SOP) and small-outline-j-lead packages (SOJ). Secondly, the plugs used are also of plastic material. The methods of prior art for pulling plugs out of IC tubes would damage the contents irreparably. Therefore, what is needed is a simple machine for pulling plugs out of IC tubes automatically.

SUMMARY OF THE INVENTION

It is therefore an object of this invention to provide an automatic plug pulling machine for integrated circuit (IC) tubes.

It is another object of this invention to provide a method for automatic pulling of plugs out of integrated circuit (IC) tubes.

In accordance with the aforementioned objects, there is provided a machine with a tube rack, robotic arms to pick up tubes from the tube rack, a platform for positioning tubes from the rack onto a tube fixing platform, a plug remover and a plug trough.

In accordance with the aforementioned objects, there is also provided a method for picking up IC tubes from a tube rack, positioning the tubes on a platform, clamping the tubes on a fixing platform, lowering a plug remover onto the plug on the IC tube, engaging the plug and pulling it from the end of the tube, and disposing the plug and the tube in a trough and a bin, respectively.

BRIEF DESCRIPTION OF THE DRAWINGS

The objects and features of this invention will become apparent more readily from a reading of the detailed description in conjunction with the drawings that follow.

DESCRIPTION OF THE PREFERRED EMBODIMENTS

Figure 1:
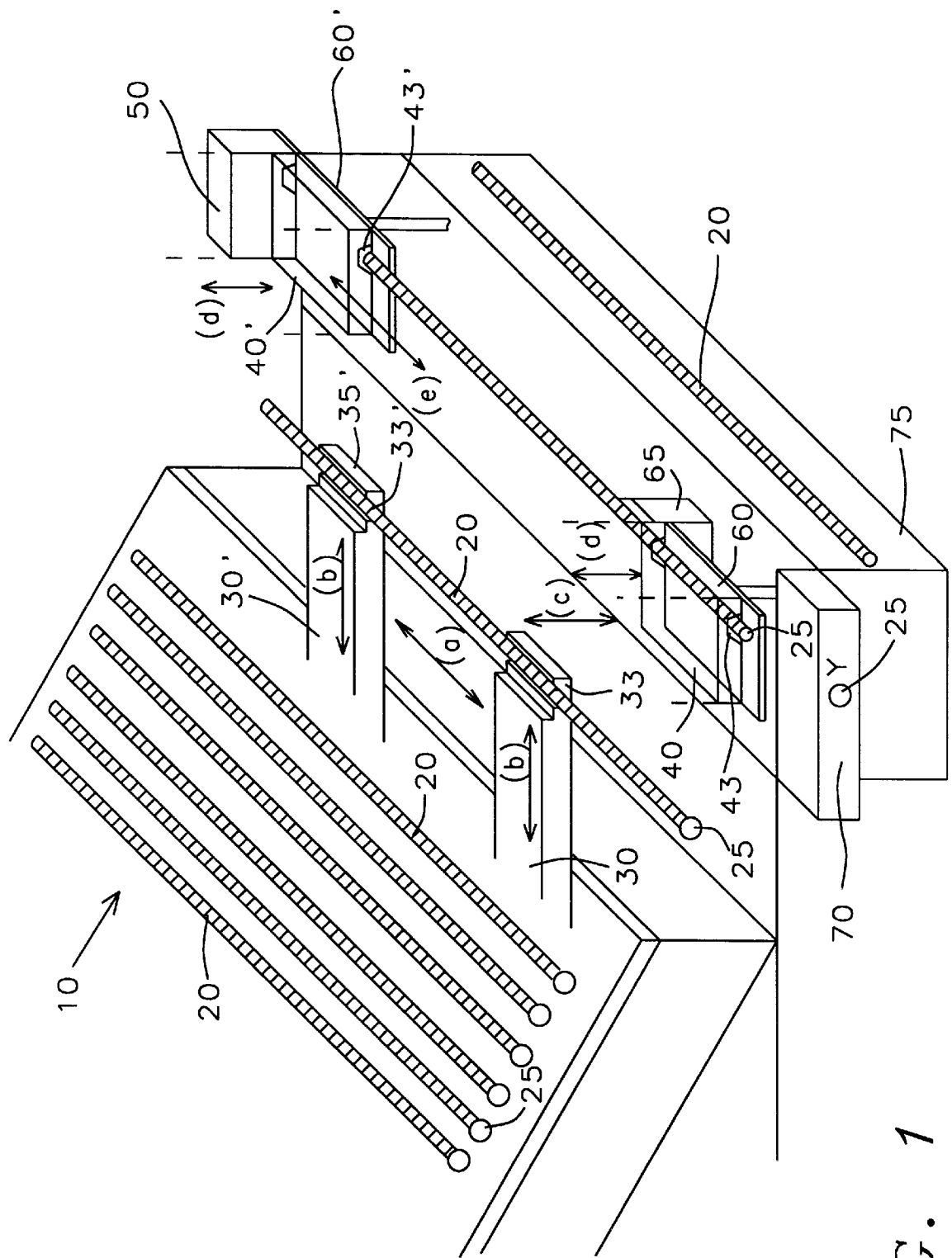
FIG. 1 is an isometric drawing showing IC tube rack and tube positioning platform along with associated plug pullers of this invention.

Referring now to the drawings, in particular to FIGS. 1–4, there is shown a machine for automatically removing plugs from integrated chip (IC) tubes (20) stacked on a rack (10). The tube has a plug (25) at one end. A tube (20) at the top position as shown in FIG. 1 progresses down the rack to the bottom position where it is then picked up by the "jaws" (33) and (33') of the two robotic arms (30) and (30'), respectively, and placed on platforms (60) and (60'). The plug end of tubes (20) is always placed precisely at the same location on platform (60) so that the plugs are removed automatically and quickly as disclosed further below. Tube (20) is first clamped onto platforms (60) and (60') by clamps (40) and (40'). Then, plug (25) is removed by plug pullers (105) and (65) shown in FIG. 4 and disposed of in trough (70) while tube (20) is pushed into bin (75) by the dual purpose robotic arms (30) and (30').

Rack (10) is capable of holding a plurality of IC tubes that can be placed on the rack in a number of different ways. It is preferred that the rack is tilted at an angle a with the horizontal and that it is placed adjacent to platforms (60) and (60') in such a way that the tubes can easily be transported onto the platforms by means of robotic arms (30) and (30') as shown in FIG. 1. Again, a number of different techniques may be employed to move the tubes from the top position on the rack to the bottom position just prior to being picked up by robotic arms (30) and (30'). For example, the rack can be vibrated, or oscillated in rhythm with the motion of arms (30) and (30'), or the tubes can simply be gravity fed by tilting the rack at an appropriate tilt angle α. In another embodiment, a picker (not shown) picks the next tube up and places it in the robotic arms.

Robotic arms (30) and (30') have jaw-like slots (33) and (33'), respectively. Each jaw, identical to the other, has grooves of different widths to accommodate tubes of different shapes and sizes and altogether form slots (33), or (33'), as the case may be. The arms are capable of moving both in the x, y as well z-directions as indicated by reference characters (a), (b) and (c), respectively. It will be appreciated that the robotic arms, can accommodate tubes of different lengths, since the distance between the robotic arms can be varied at will by moving one closer to or further from the other. The lateral (a) movement of the arms can be accomplished by any number of ways, including of ball bearing slides, for example.

The back and forth motion of the robotic arms can also be accomplished by means of pistons that can be housed / inside and under the rack. In this arrangement, the arms can retract into the rack under the bottom tube on the rack and adjust its position vertically to pick up the bottom tube with its jaws and transport the tube to the platforms (60) and (60'). The vertical motion of the robotic arms can be accomplished by vertical slides on which the arms are slidably attached. In an alternate embodiment, the base of the vertical slides slide on horizontal tracks to enable the robotic arms to move laterally.

Figure 2A:
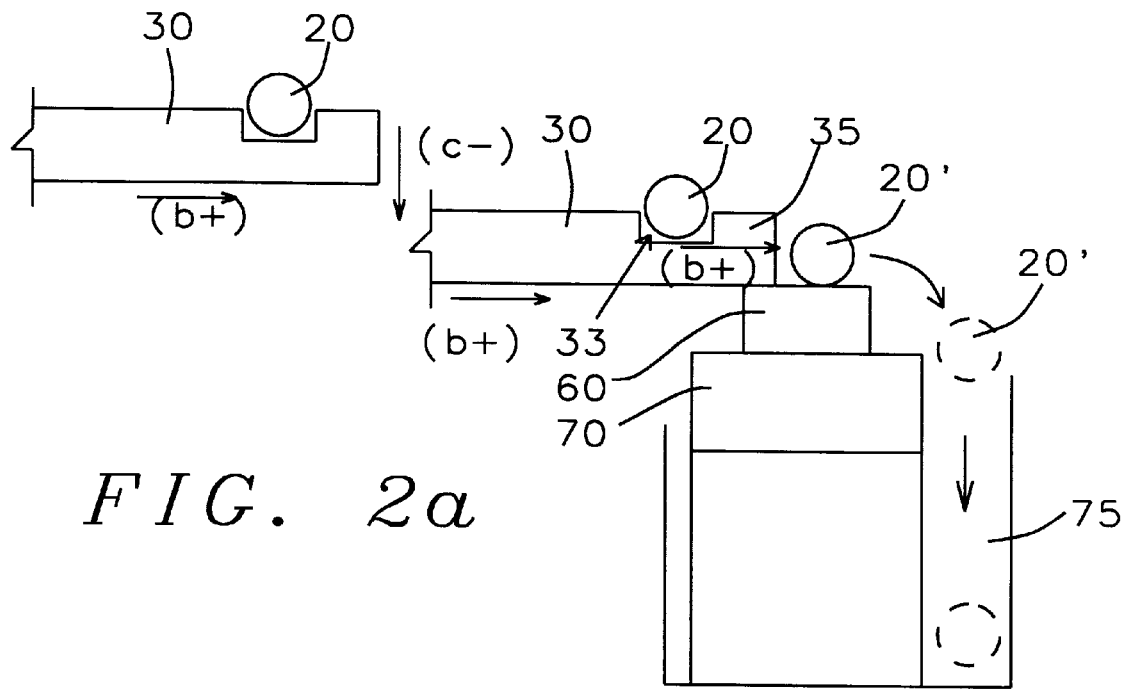
FIG. 2a–2b show the movement of the robotic arms in picking up a new tube, transporting the tube to supporting platforms of this invention, discarding a tube from a previous operation on the platforms, and retracting to repeat the operation.
Figure 2B:
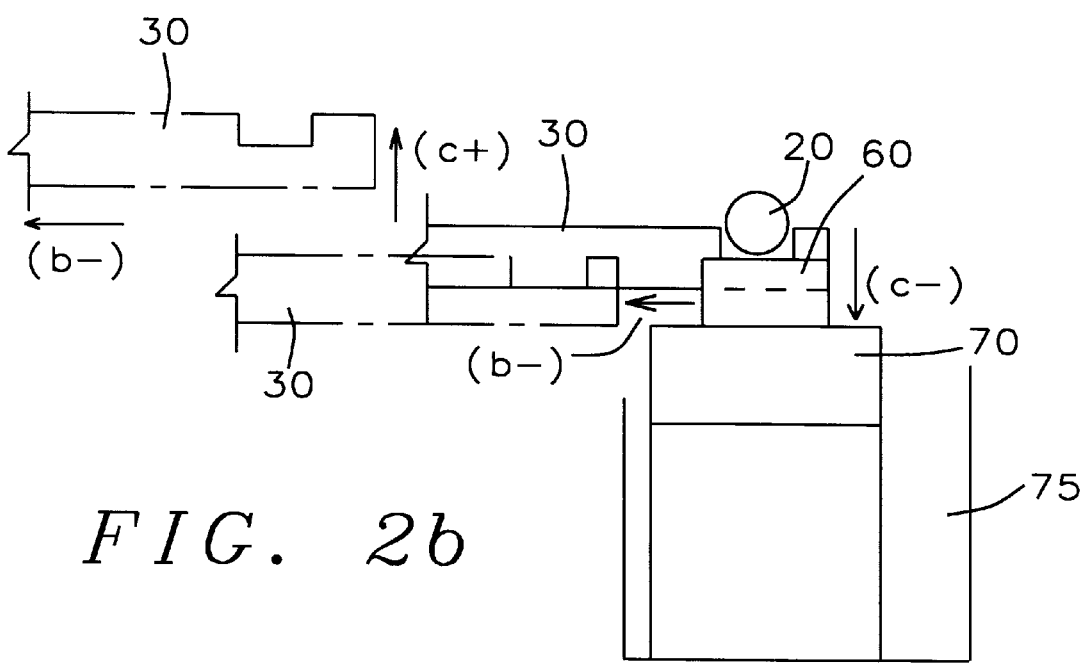

The various motions of robotic arms shown in FIG. 1 can be better seen in FIGS. 2a and 2b. For the purposes of FIGS. 2a and 2b, vertical motion (c) is depicted as positive, i.e., (c+) when it is upwards, and as negative, (c−), when it is downwards. Similarly, lateral motion (b) is depicted as positive, (b+) when it is to the right, and negative (b−), when it is to the left as seen in FIGS. 2a–2b. Thus, robotic arm (30), after picking up tube (20) from rack (10), moves incrementally forward (b+) and then downwards (c−) to a level in line with the top of platform (60) as shown in FIG. 2a. In this position, face (35) of the robotic arm is also lined up with tube (20') which has already been unplugged from the previous unplugging operation and is ready to be pushed from platform (60) into bin (75). It will be noted that since robotic arms (30) and (30') operate between platforms (60) and (60') as shown in FIG. 1, any interference between the arms and the platforms is avoided. Thus, alignment of the robotic arms with the platforms is not critical as long as there is sufficient alignment between faces (35) and (35') and tube (20') so that the robotic faces can push tube (20') into bin (75). With another incremental forward motion (b+), therefore, arm (30) of FIG. 2a pushes tube (20') into bin (75), stops, and then moves downward (c−) to place the new tube (20) on platform (60) as shown in FIG. 2b. Once tube (20) is placed on the platform, robotic arm (30) moves backward in (b−) direction and then moves upward (c+) to assume the position to pick another tube from rack (10).

It will be appreciated that motions (c) and (b) can be prescribed in several different ways. For example, after picking up a new tube from rack (10), the robotic arm can be made to move first down in (c−) direction and then forward in (b+) direction to push tube (20') out of the way, and then downward (c−) without stopping in between. That is, the last two movements can be accomplished simultaneously. Similarly, in moving back, the arm can move back to the original position by the rack in a continues manner rather than making discrete lateral and vertical movements. The key aspect here is the ability of the jaws of the robotic arms to pick up a tube from the rack, push a tube off of the two supporting platforms, and place the new tube on the platforms, and then retract to start the operation over again.

Referring back to FIG. 1, platform (60) on the left side, as viewed in FIG. 1, is fixed in position while platform (60') on the right is movable in the lateral direction (e) as shown in the same FIG. Tubes are always placed at a predetermined location on the left platform (60) so that the plugs are properly positioned to be removed. On the other hand, platform (60') on the right is adjustable to accommodate different length tubes. The adjustment can be accomplished by conventional methods, such as a motor driven piston which is depicted as (50) in FIG. 1. Once tube (20) is placed on platforms (60), (60'), the tube is fixedly clamped onto the platforms by means of clamps (40) and (40') which are lowered from a superstructure (55) shown in FIG. 3. Clamps (40), (40') are actuated by their respective cluster machinery (45), (45') attached (not shown) to superstructure (55), and while both (45) and (45') can move vertically (d), (45') can also move laterally (h) to accommodate different length tubes.

Figure 4:
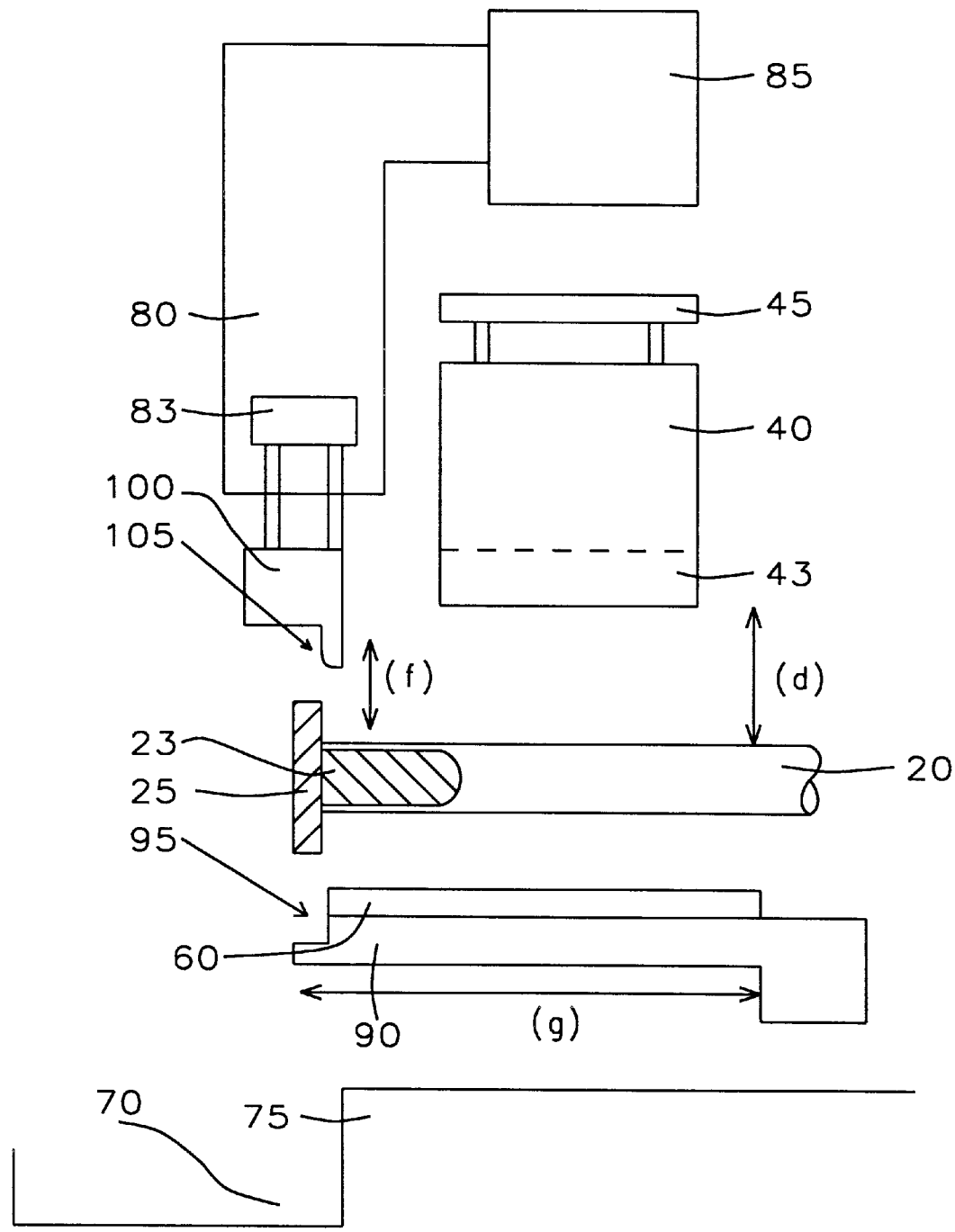
FIG. 4 is a schematic drawing showing the head of the plug being positioned on a platform over a collecting trough with respect to the vertical and horizontal plug pullers of this invention.

As a main feature and key aspect of this invention, plug (25) is now removed from tube (20) shown in FIG. 4 by pushing the plug by two novel plug pullers (90) and (100). Puller (90) pulls the plug from the underside of its head (25) while puller (100) pulls the plug from the topside of its head (25). Puller (90) is positioned freely under the underside of platform (60) and is shaped with a step, or notch (95) at the plug end to receive plug (25). Puller (90) is actuated by a piston arrangement (97) to move laterally (g) as shown in FIG. 4 and notch (95) fits onto the head of plug (25). It will be noted that tube (20) remains fixed on platforms (60) and (60') as puller (90) moves back and forth to push plug out of tube (20).

Figure 3:
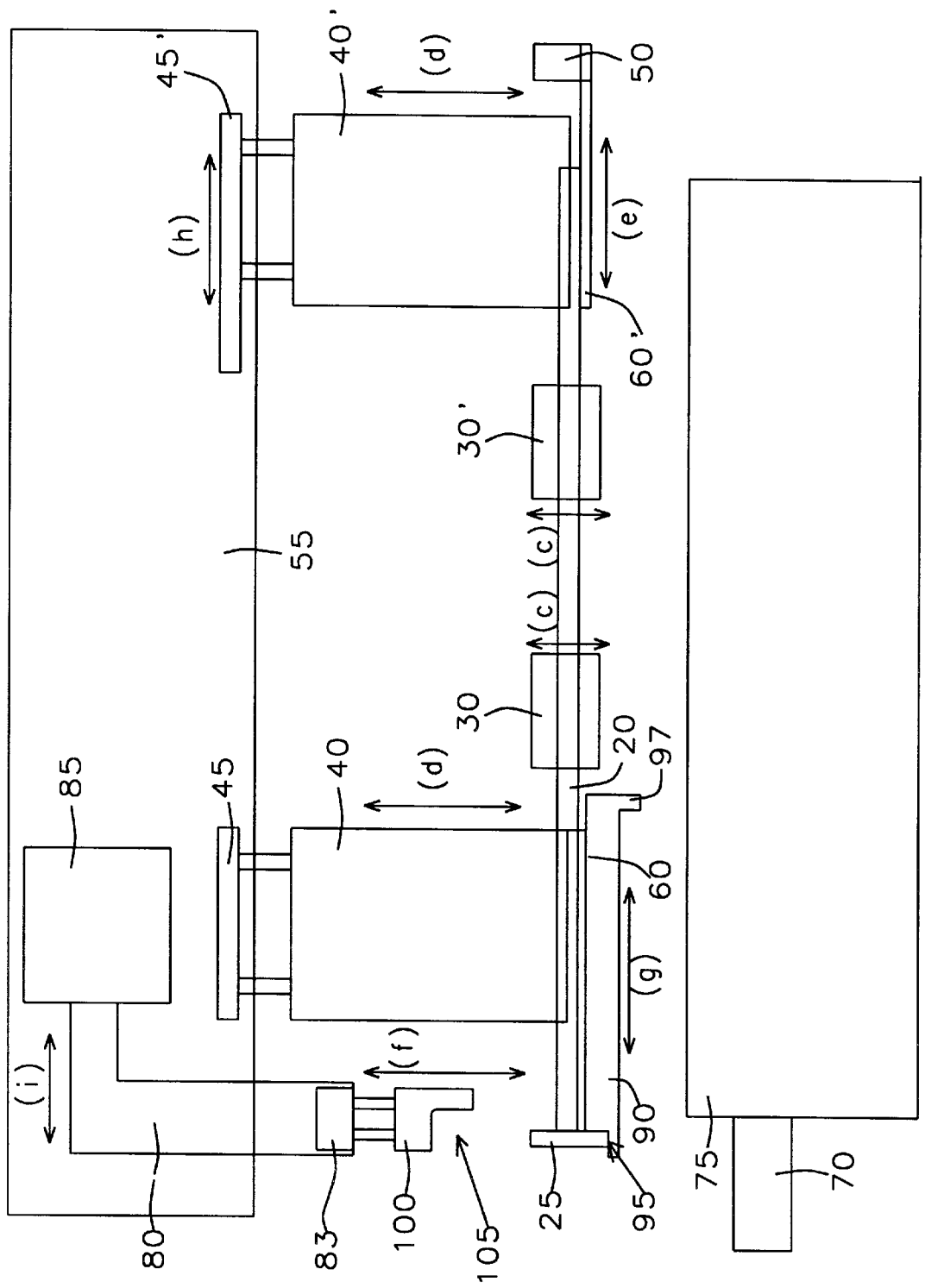
FIG. 3 is a side view of the isometric tube and rack drawing of FIG. 1 of this invention.

Puller (100) is first lowered onto the topside of plug (25) by preferably a piston arrangement block (83) shown in FIGS. 3 and 4. Notch (105) fits onto the head of plug (25). Puller (100) is moved laterally (i) by another piston arrangement block (85) shown in FIGS. 3 and 4. Thus pullers (90) and (100) are moved laterally both in unison or alternately to push plug (25) out of tube (20) and drop the plug into bin (70). Puller (90) can be moved at a different speed from puller (100) so that notch (95) of puller (90) is retracted out of the way of plug (25) to fall in trough (70) while puller (100) continues to push the plug into the trough. The process of moving pullers (90) and (100) back and forth can be repeated as many times as needed, but the plug is usually dislodged from the tube after one or two pushes.

Once the plug is removed from tube (20) in the prescribed manner, clamps (40) and (40') are retracted vertically to let tube (20) rest freely on platforms (60) and (60'). Then, arms (30) and (30') pick up the next tube from rack (10), and approach the free tube and nudge it off the platforms—with faces (35) and (35')—to roll it into bin (75) before placing the next tube onto the platforms. The process of removing plugs from IC tubes is then repeated.

Another key aspect of the present invention is, in general, the flexibility of the disclosed Automatic Plug Pulling Machine for IC Tubes of different lengths, shapes and sizes. In particular, puller fixtures (90) and (100) can be made changeable by simply removing them from their holders and replacing them with fixtures having the appropriate shape and size for a particular tube.

While the invention has been particularly shown and described with reference to the preferred embodiments thereof, it will be understood by those skilled in the art that various changes in form and details may be made without departing from the spirit and scope of the invention.

What is claimed is:

1. An automatic plug pulling machine for IC tubes comprising:
   a rack for placing integrated circuit tubes thereon;
   said rack having a plurality of movable robotic arms;
   means to move said movable robotic arms;
   a plurality of platforms having at least a first and a second platform adjacent to said rack;
   a means to move said second platform;
   a plurality of movable clamps which can be positioned over said platforms;
   a means to move said movable clamps;
   a first plug pusher disposed underneath said first platform;
   a means to move said first plug pusher;
   a second plug pusher disposed above said first platform;
   a means to actuate said second plug pusher;
   means to collect plug removed with said plug pushers;
   means to displace unplugged said IC tube from said platforms; and
   means to collect said unplugged IC tube.

2. The plug pulling machine of claim 1, wherein said integrated circuit tubes have one closed end and an end pluggable with a removable plug.

3. The plug pulling machine of claim 2, wherein said plug has a head.

4. The plug pulling machine of claim 1, wherein said rack is inclined at an angle to said platforms.

5. The plug pulling machine of claim 1, wherein said movable robotic arms have plurality of slots.

6. The plug pulling machine of claim 1, wherein said movable robotic arms have flat faces.

7. The plug pulling machine of claim 6, wherein said plurality of slots are formed to hold integrated circuit tubes.

8. The plug pulling machine of claim 1, wherein said movable robotic arms move horizontally to accommodate the length of said tubes.

9. The plug pulling machine of claim 1, wherein said movable robotic arms move vertically to pick up and to release said tubes.

10. The plug pulling machine of claim 1, wherein said first platform is fixed in position.

11. The plug pulling machine of claim 1, wherein said means to move second platform is accomplished with a cluster of pistons actuated horizontally.

12. The plug pulling machine of claim 1, wherein said means to move said movable clamps is accomplished with a cluster of pistons actuated vertically.

13. The plug pulling machine of claim 1, wherein said means to move said first plug pusher is accomplished with a cluster of pistons actuated horizontally.

14. The plug pulling machine of claim 1, wherein said means to move said second plug pusher is accomplished with a cluster of pistons actuated vertically.

15. The plug pulling machine of claim 1, wherein said means to collect said plug removed with said plug pushers is accomplished with a trough disposed at the edge of said first platform.

16. The plug pulling machine of claim 1, wherein said means to displace unplugged said IC tube from said platforms is accomplished with said robotic arms pushing against said integrated circuit tube.

17. The plug pulling machine of claim 1, wherein said means to collect said unplugged integrated circuit tubes is accomplished with a bin positioned below said platforms.

18. A method for automatically pulling plugs from integrated circuit tubes comprising the steps of:
   providing IC tubes with plugs at one end;
   providing a rack for said IC tubes;
   placing an IC tube from said rack onto a set of robotic arms;
   providing a plurality of platforms comprising at least a first platform and a second platform.
   moving said robotic arms towards said platforms;
   displacing an existing tube on said platforms;

placing said tube in said robotic arms onto said platforms;

clamping said tube onto said platforms;

pushing on the underside of said plug of said tube;

pushing on the topside of said plug of said tube;

dislodging said plug form said tube;

collecting said dislodged plug; and collecting said tube without said plug.

19. The method of claim 18, wherein said robotic arms have slots to receive said tubes with said plugs having heads.

20. The method of claim 19, wherein said robotic arms move upwards to pick up said tube from said rack.

21. The method of claim 19, wherein said robotic arms move towards said platforms to displace an existing tube on said platforms by pushing on said existing tube with said flat faces on said robotic arms.

22. The method of claim 18, wherein said placing said tube onto said platforms is accomplished by lowering said robotic arms.

23. The method of claim 18, wherein said clamping said tube onto said platforms is accomplished by moving a set of clamps onto said tube in a vertical direction.

24. The method of claim 18, wherein said pushing on the underside of said plug of said tube is accomplished with a first plug pusher.

25. The method of claim 24, wherein said first plug pusher is disposed on the underside of said first platform.

26. The method of claim 18, wherein said pushing on the topside of said plug of said tube is accomplished with a second plug pusher.

27. The method of claim 26, wherein said second plug pusher is disposed above the edge of said first platform.

28. The method of claim 18, wherein said dislodging said plug from said tube is accomplished by pushing on the underside of said plug with said first plug pusher, and on the topside with said second plug pusher.

29. The method of claim 18, wherein said collecting said dislodged plug is accomplished in a trough placed below said plug.

30. The method of claim 18, wherein said collecting said plug is accomplished in a bin paced below said tube.

* * * * *